United States Patent
Chen et al.

(10) Patent No.: US 10,879,138 B1
(45) Date of Patent: Dec. 29, 2020

(54) SEMICONDUCTOR PACKAGING STRUCTURE INCLUDING INTERCONNECTION TO PROBE PAD WITH PROBE MARK AND METHOD OF MANUFACTURING THE SAME

(71) Applicant: Taiwan Semiconductor Manufacturing Co., Ltd., Hsinchu (TW)

(72) Inventors: Hsien-Wei Chen, Hsinchu (TW); Ching-Jung Yang, Taoyuan (TW); Jie Chen, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/440,998

(22) Filed: Jun. 14, 2019

(51) Int. Cl.
*H01L 21/66* (2006.01)
*H01L 23/00* (2006.01)
*H01L 23/544* (2006.01)

(52) U.S. Cl.
CPC .............. *H01L 22/32* (2013.01); *H01L 22/20* (2013.01); *H01L 23/544* (2013.01); *H01L 24/03* (2013.01); *H01L 24/08* (2013.01)

(58) Field of Classification Search
CPC ......... H01L 22/32; H01L 24/03; H01L 24/08; H01L 22/20; H01L 23/544
See application file for complete search history.

(56) References Cited

U.S. PATENT DOCUMENTS

| | | | |
|---|---|---|---|
| 6,251,694 B1* | 6/2001 | Liu | H01L 22/20 257/E21.525 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2014/0042613 A1* | 2/2014 | Satake | H01L 22/32 257/734 |
| 2014/0070832 A1* | 3/2014 | Fay | H05K 999/99 324/754.11 |

* cited by examiner

*Primary Examiner* — John P. Dulka
(74) *Attorney, Agent, or Firm* — JCIPRNET

(57) ABSTRACT

Provided is a semiconductor structure including a substrate, an interconnect structure, a pad, a protective layer, and a bonding structure. The interconnect structure is disposed over the substrate. The pad is disposed over and electrically connected to the interconnect structure. A top surface of the pad has a probe mark and the probe mark has a concave surface. The protective layer conformally covers the top surface of the pad and the probe mark. The bonding structure is disposed over the protective layer. The bonding structure includes a bonding dielectric layer and a first bonding metal layer penetrating the bonding dielectric layer and the protective layer to electrically connect to the pad. A method of manufacturing the semiconductor structure is also provided.

20 Claims, 12 Drawing Sheets

SEMICONDUCTOR PACKAGING STRUCTURE INCLUDING INTERCONNECTION TO PROBE PAD WITH PROBE MARK AND METHOD OF MANUFACTURING THE SAME

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
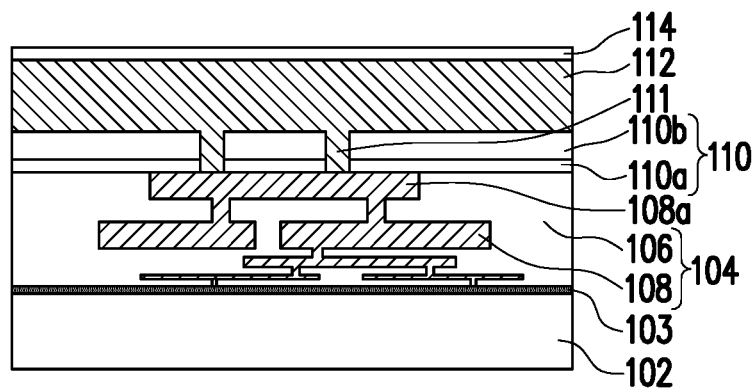
FIG. 1A to FIG. 1F are cross-sectional views of a method of forming a semiconductor structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are cross-sectional views of a method of forming a semiconductor structure in accordance with a first embodiment.

Figure 1B:
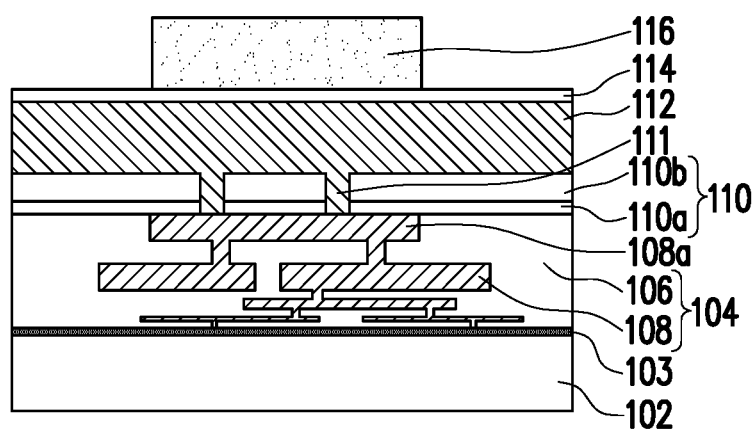
Figure 1C:
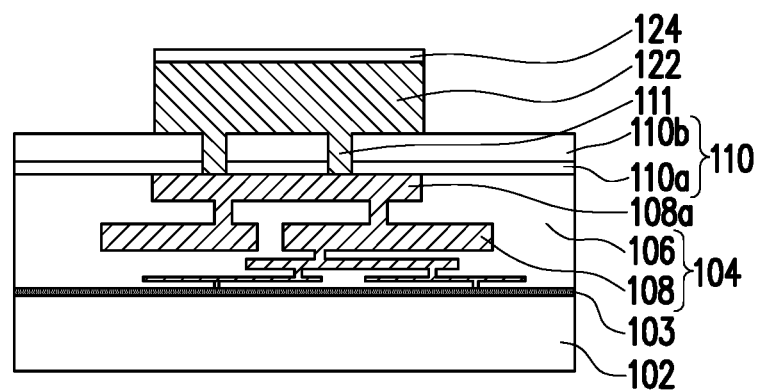
Figure 1D:
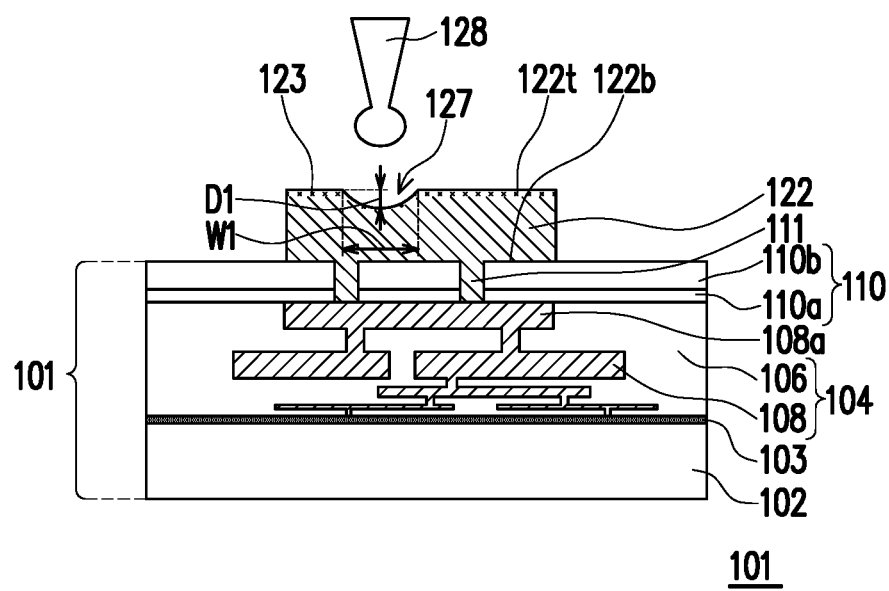
Figure 1E:
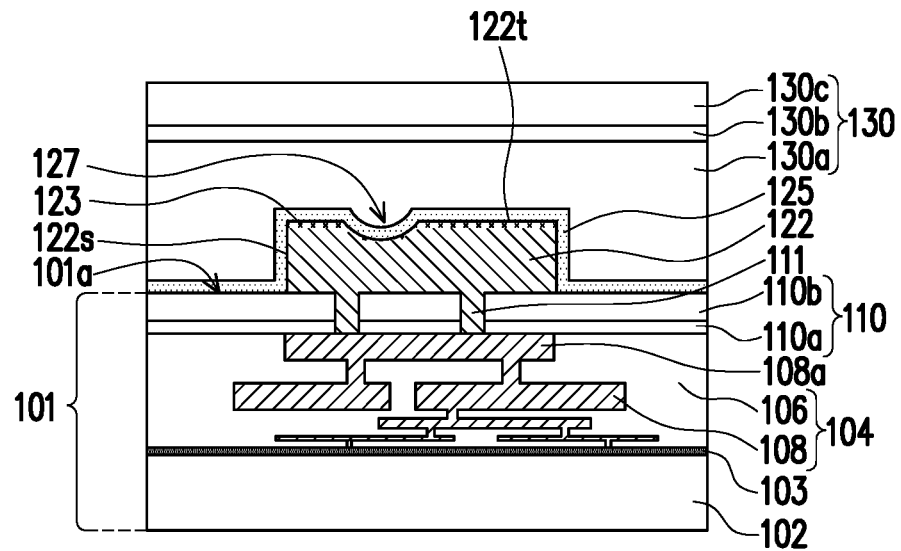
Figure 1F:
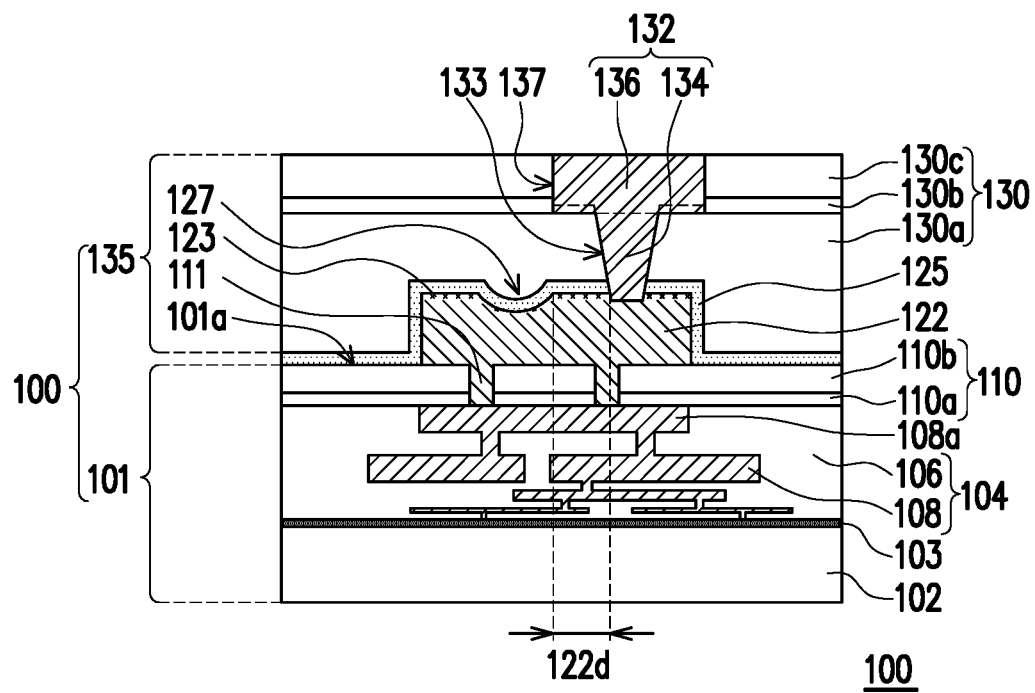

Referring to FIG. 1A, a method of forming a semiconductor structure 100 (as shown in FIG. 1F) includes following steps. First, an initial structure illustrated in FIG. 1A is provided. The initial structure includes a semiconductor substrate 102, a device layer 103, an interconnect structure 104, a passivation layer 110, a conductive material 112, and a cap material 114.

In some embodiments, the semiconductor substrate 102 may include silicon or other semiconductor materials. Alternatively, or additionally, the semiconductor substrate 102 may include other elementary semiconductor materials such as germanium. In some embodiments, the semiconductor substrate 102 is made of a compound semiconductor such as silicon carbide, gallium arsenic, indium arsenide or indium phosphide. In some embodiments, the semiconductor substrate 102 is made of an alloy semiconductor such as silicon germanium, silicon germanium carbide, gallium arsenic phosphide, or gallium indium phosphide. In some embodiments, the semiconductor substrate 102 includes an epitaxial layer. For example, the semiconductor substrate 102 has an epitaxial layer overlying a bulk semiconductor.

In some embodiments, the device layer 103 is formed over the semiconductor substrate 102 in a front-end-of-line (FEOL) process. The device layer 103 includes a wide variety of devices. In some embodiments, the devices comprise active components, passive components, or a combination thereof. In some embodiments, the devices may include integrated circuits devices. The devices are, for example, transistors, capacitors, resistors, diodes, photodiodes, fuse devices, or other similar devices. In some embodiments, the device layer 103 includes a gate structure, source and drain regions, and isolation structures, such as shallow opening isolation (STI) structures (not shown). In the device layer 103, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the semiconductor substrate 102. The functions of the devices may include memory, processors, sensors, amplifiers, power distribution, input and/or output circuitry, or the like.

Referring to FIG. 1A, the interconnect structure 104 is formed over the device layer 103. In detail, the interconnect structure 104 includes an insulating material 106 and a plurality of metal features 108. The metal features 108 are formed in the insulating material 106 and electrically connected to the device layer 103. A portion of the metal features 108, such as a top metal feature 108a, is exposed by the insulating material 106. In some embodiments, the insulating material 106 includes an inner-layer dielectric (ILD) layer on the device layer 103, and at least one inter-metal dielectric (IMD) layer over the ILD layer. In some embodiments, the insulating material 106 includes silicon oxide, silicon nitride, silicon oxynitride, tetraethyl-orthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, benzocyclobutene (BCB), SiLK™ (Dow Chemical, Midland, Mich.), polyimide, other low-k dielectric material, or combinations thereof. In some alternatively embodiments, the insulating material 106 may be a single layer or multiple layers. In some embodiments, the metal features 108 include plugs and metal lines. The plugs may include contacts formed in the ILD layer, and vias formed in the IMD layer. The contacts are formed between and in connect with the device layer 103 and a bottom metal line. The vias are formed between and in connect with two metal lines. The metal features 108 may be made of tungsten (W), copper (Cu), copper alloys, aluminum (Al), aluminum alloys, or a combination thereof. In some alternatively embodiments, a barrier layer (not shown) may be formed between the metal features 108 and the insulating material 106 to prevent the material of the metal features 108 from migrating to or diffusion to the device layer 103. A material of the barrier layer includes tantalum, tantalum nitride, titanium, titanium nitride, cobalt-tungsten (CoW) or a combination thereof, for example.

Referring to FIG. 1A, the passivation layer 110 is formed over the interconnect structure 104. In some embodiments, the passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like. In an embodiment, the passivation layer 110 may be a single layer structure, a bilayer structure, or a multilayer structure. As shown in FIG. 1A, the passivation layer 110 includes a passivation material 110a and a passivation material 110b formed over the passivation material 110b. The passivation materials 110a and 110b have different materials. For example, the passivation material 110a may include silicon nitride, while the passivation material 110b may include polyimide (PI) or any material different from silicon nitride.

Referring to FIG. 1A, the conductive material 112 is formed over the passivation layer 110 and electrically connected to the top metal features 108a and 108b by plugs 111 which penetrate through the passivation layer 110. The conductive material 112 and the metal features 108 may have different materials. In some embodiments, the conductive material 112 is softer than the metal features 108. The conductive material 112 and the plugs 111 may have a same material. In some embodiments, the conductive material 112 and the plugs 111 respectively include a metal material, such as aluminum, copper, nickel, gold, silver, tungsten, or a combination thereof, which may be formed by patterning the passivation layer 110 to form a plurality openings to reach the metal features 108, depositing a metal material layer to fill in the openings and cover the passivation layer 110 through a suitable process such as electro-chemical plating process, CVD, atomic layer deposition (ALD), PVD or the like, and then patterning the metal material layer.

Referring to FIG. 1A, the cap material 114 is formed over the conductive material 112. The cap material 114 may be a dielectric material, for example. In some embodiments, the cap material 114 includes a nitrogen-containing material, such as silicon oxynitride, silicon nitride or a combination thereof, and has a thickness of 50 nm to 100 nm. In another embodiment, the cap material 114 is referred to as an anti-reflective coating (ARC) layer, which may include an organic ARC material (e.g., polymer resin), an inorganic ARC material (e.g., SiON), or a combination thereof. In some alternatively embodiments, the cap material 114 may be a single layer or multiple layers and may be formed by a suitable process such as CVD, ALD, or the like.

Referring to FIG. 1B, a mask pattern 116 is formed over the cap material 114. In some embodiments, the mask pattern 116 is used to define a position of a to-be-formed pad 122 (as shown in FIG. 1C). In one embodiment, the mask pattern 116 includes photoresist and is formed by a suitable process, such as a spin coating and a photolithography process.

Referring to FIG. 1B and FIG. 1C, after the mask pattern 116 is formed, a first etching process is performed by using the mask pattern 116 as an etching mask to remove portions of the cap material 114 and the conductive material 112, so as to expose the passivation material 110b. In some embodiments, the first etching process may include a dry etching process, a wet etching process, or a combination thereof. In the case, as shown in FIG. 1C, a pad 122 and a cap layer 124 disposed over the pad 122 are formed. The pad 122 is electrically connected to the top metal feature 108a by the plugs 111. In some embodiments, the pad 122 may be aligned with or partially overlapped with the top metal feature 108a. Although only one pad 122 and one cap layer 124 are illustrated in FIG. 1C, the embodiments of the present disclosure are not limited thereto. In other embodiments, the number of the pad 122 and the cap layer 124 may be adjusted by the need. After the pad 122 and the cap layer 124 are formed, the mask pattern 116 is removed.

Referring to FIG. 1C and FIG. 1D, a second etching process is performed on the cap layer 124 to expose the pad 122. In one embodiment, the second etching process may include an isotropic etching process. In another embodiment, the second etching process may include a wet etching process or a combination of a wet etching process and a dry etching process. The wet etching process may be performed by using an etching solution which includes halogen, such as F, Cl, Br, or a combination thereof. For example, the etching solution may include a HF solution, a HCl solution, a HBr solution, or a combination thereof. The dry etching process may be performed by using an etching gas which includes halogen, such as F, Cl, Br, or a combination thereof. In the case, as shown in FIG. 1D, a top surface or top portion 122t of the pad 122 is modified, so that a resistance value of the top portion 122t of the pad 122 is less than a resistance value of a bottom portion 122b of the pad 122.

Figure 7:
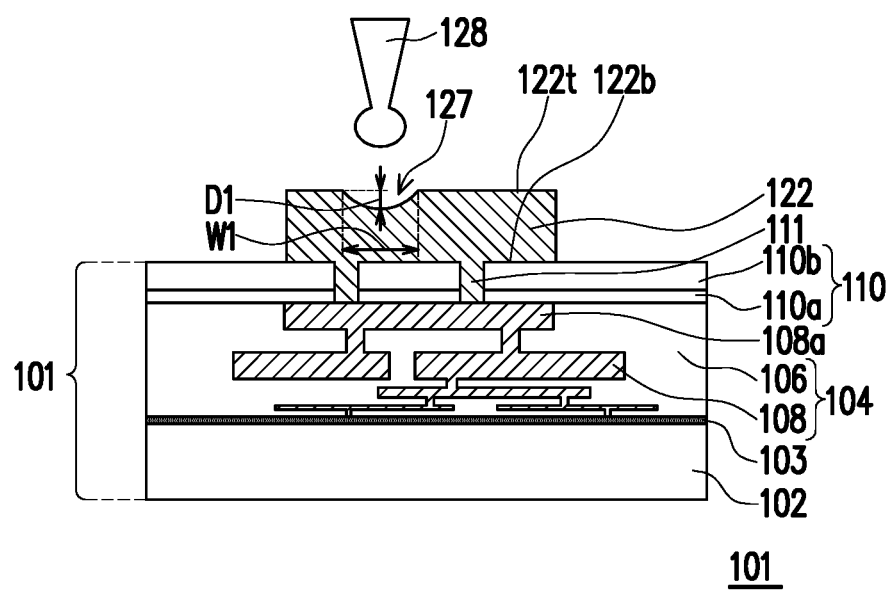
FIG. 7 is a cross-sectional view showing a semiconductor structure in accordance with another embodiment.

In alternative embodiments, some residues 123 may be formed in or on the pad 122. Herein, the residues 123 may be a chemical residue during the second etching process. Accordingly, the residues 123 may be from the cap layer 124 and the pad 122 which may have the nitrogen-containing material, such as silicon oxynitride, silicon nitride or a combination thereof, and the metal material, such as aluminum, copper, nickel, gold, silver, tungsten, or a combination thereof. In some alternative embodiments, a resistance value of the pad 122 with the residues 123 is greater than a resistance value of the other pad without the residues (as shown in FIG. 7). In an embodiment, the residues 123 may blanketly or continuously cover the pad 122. Alternatively, the residues 123 may partially or non-continuously cover the pad 122. In other embodiments, the charge accumulation may occur on the top surface or top portion 122t of the pad 122, which may affect the resistance value of the top portion 122t of the pad 122.

As shown in FIG. 1D, after the cap layer 124 is removed, a circuit probing (CP) test is performed on the pad 122. Specifically, a probe 128 may be used to electrically couple to the pad 122 for wafer or die testing to check whether the die is a good die. In some embodiments, the CP test is also referred to as wafer acceptance testing (WAT). In some embodiments, the pad 122 is used for electrical testing to check whether a first die 101 illustrated in FIG. 1D is a good die, but the disclosure is not limited thereto. The first die 101 may be selected to test different properties of the wafer or the die, such as leakage current, breakdown voltage, threshold voltage and effective channel length, saturation current, contact resistance and connections. It should be noted that the first die 101 is selected to proceed the following process when the first die 101 is identified as a known good die (KGD). In the case, as shown in FIG. 1D, a probe mark 127 is formed at the top portion 122t of the pad 122, and the probe mark 127 may be a recess concaving or recessing into the top surface 122t of the pad 122. That is, the probe mark 127 has a concave surface or a curve concaving downward. Since the probe 128 may press or squeeze the residues 123 to electrically connect to the pad 122 during the CP test, the residues 123 underlying the probe mark 127 may be squeezed to two sides of the probe mark 127 after the CP test, as shown in FIG. 1D. That is, the top portion 122t underlying the probe mark 127 may have a lower resistance than the top portion 122t aside the probe mark 127. In some embodiments, the probe mark 127 may have a depth D1 of 50 nm to 2000 nm, and a width W1 of 1000 nm to 50000 nm. In some alternative embodiments, a ratio of the width W1 to the depth D1 is 0.5 to 1000. Herein, the depth D1 is a vertical distance between a topmost point (or the top surface 122t) and a bottommost point of the probe mark 127.

Referring to FIG. 1E, after the CP test, a protective layer 125 is formed over the pad 122. In detail, the protective layer 125 conformally covers and is in direct contact with the top surface 122t and sidewalls 122s of the pad 122, the probe mark 127, and a top surface of the passivation layer 110. In the case, the protective layer 125 conformally covering the probe mark 127 has another concave surface corresponding to the concave surface of the probe mark 127. Herein, when a layer described as "conformally cover", the layer is formed with a uniform thickness and extends along the surface topography of the underlying layer or structure. In some embodiments, the protective layer 125 may include a dielectric layer, such as silicon nitride, silicon oxynitride, or a combination thereof, and has a thickness of 50 nm to 100 nm. When the thickness of the protective layer 125 is greater than the depth D1 of the probe mark 127, the protective layer 125 may fill up the probe mark 127. That is, a lowest point of a top surface of the protective layer 125 directly over the probe mark 127 may be higher than the top surface 122t of the pad 122. On the other hand, when the thickness of the protective layer 125 is less than the depth D1 of the probe mark 127, the protective layer 125 may not fill up the probe mark 127. That is, the lowest point of the top surface of the protective layer 125 directly over the probe mark 127 may be lower than the top surface 122t of the pad 122. In other embodiments, the lowest point of the top surface of the protective layer 125 directly over the probe mark 127 and the top surface 122t of the pad 122 may be at the same level.

In another embodiment, the protective layer 125 is referred to as an anti-reflective coating (ARC) layer, which may include an organic ARC material (e.g., polymer resin), an inorganic ARC material (e.g., SiON), or a combination thereof. In some alternatively embodiments, the protective layer 125 may be a single layer or multiple layers and may be formed by a suitable process such as CVD, ALD, or the like. In other embodiments, the protective layer 125 and the cap layer 124 may have different materials.

After forming the protective layer 125, a first bonding structure 135 is formed over the protective layer 125. Specifically, as shown in FIG. 1E, after the first die 101 is identified as the known good die, a bonding dielectric material 130a (or referred as a first bonding dielectric material) is disposed over a front side 101a of the first die 101. In some embodiments, as shown in FIG. 1E, the bonding dielectric material 130a covers the protective layer 125 and fills in the probe mark 127. In some embodiments, the bonding dielectric material 130a includes silicon oxide, silicon nitride, a polymer or a combination thereof. The bonding dielectric material 130a is formed by a suitable process such as spin coating, CVD or the like.

In FIG. 1E, a blocking layer 130b is then formed to cover the bonding dielectric material 130a. In some embodiments, the blocking layer 130b includes a dielectric material, such as silicon oxide, silicon nitride, silicon oxynitride, or a combination thereof, and is formed by a suitable process such as CVD, ALD, or the like. In some embodiments, a thickness of the blocking layer 130b is 50 µm to 100 µm.

In FIG. 1E, another bonding dielectric material 130c (or referred as a second bonding dielectric material) is formed over the blocking layer 130b. That is, the blocking layer 130b is disposed between the bonding dielectric materials 130a and 130c. In some embodiments, a material of the blocking layer 130b is different from that of the bonding dielectric material 130a and 130c. For example, the blocking layer 130b may include silicon nitride, while the bonding dielectric materials 130a and 130c may include silicon oxide. However, the embodiments of the present disclosure are not limited thereto. In other embodiments, the bonding dielectric material 130a and 130c and the blocking layer 130b have different materials. In some embodiments, the bonding dielectric material 130c includes silicon oxide, silicon nitride, polymer or a combination thereof. The bonding dielectric material 130c is formed by a suitable process such as spin coating, CVD or the like. Thereafter, a planarization process may be performed on the bonding dielectric material 130c, so that a top surface of the bonding dielectric material 130c has a flat surface, in some embodiments. In alternative embodiments, the planarization process includes a CMP process, an etching back process, or a combination thereof.

After a bonding dielectric layer 130 which includes the bonding dielectric materials 130a and 130c and the blocking layer 130b between the bonding dielectric materials 130a and 130c is formed, a bonding metal layer 132 is formed in the bonding dielectric layer 130, thereby accomplishing a semiconductor structure 100, as shown in FIG. 1F. In some embodiments, the semiconductor structure 100 may include a semiconductor die, a semiconductor chip, a semiconductor wafer, or a combination thereof. In the embodiment, the semiconductor structure 100 includes the first die 101 and the first bonding structure 135 over the front side 101a of the first die 101. The first die 101 may be an application-specific integrated circuit (ASIC) chip, an analog chip, a sensor chip, a wireless and radio frequency chip, a voltage regulator chip or a memory chips, for example.

In FIG. 1F, the bonding metal layer 132 corresponds to and is electrically connected to the pad 122. Herein, the bonding metal layer 132 may be landed on and in contact with the pad 122. In some embodiments, the bonding metal layer 132 includes a via plug 134 and a metal feature 136. The metal feature 136 is a via plug having a larger area than the via plug 134, for example. As shown in FIG. 1F, the via plug 134 penetrates through the bonding dielectric material 130a and the protective layer 125 to land on and contact the pad 122. The metal feature 136 penetrates through the bonding dielectric material 130c and the blocking layer 130b to connect to the via plug 134. In other words, the metal feature 136 is electrically connected to the pad 122 through the via plug 134. The bonding metal layer 132 is electrically connected to the top metal feature 108a through the pad 122 and the plugs 111. In some embodiments, the bonding metal layer 132 is formed by a dual damascene method. In addition, although only one bonding metal layer 132 is illustrated in FIG. 1F, the embodiments of the present disclosure are not limited thereto. In other embodiments, the number of the bonding metal layer 132 may be adjusted by the need. For example, the number of the bonding metal layer 132 is plural, and the bonding metal layers 132 may be arranged as an array landing on the pad 122.

In general, the bonding metal layer 132 may be formed by a trench first process, a via hole first process, or a self-aligned process, which is described in detail as below.

In some embodiments, the bonding metal layer 132 is formed as following steps (referred as the trench first process). The bonding dielectric material 130c and the blocking layer 130b are patterned by lithography and etching processes to form a trench 137 therein. The trench 137 corresponds to the pad 122, which means the trench 137 may be aligned with or partially overlapped with the pad 122. During the etching process, the blocking layer 130b serves as an etching stop layer, and thus the blocking layer 130b is exposed or penetrated by the trench 137. Next, the bonding dielectric material 130a is patterned by another lithography and etching processes with the protective layer 125 as an etching stop layer and then the protective layer 125 is etched to form a via hole 133 therein. In the embodiment, the protective layer 125 is referred to as an etching stop layer for forming the via hole 133. In one embodiment, the etching process may include an anisotropic etching process with a plurality of etching steps, which are used to remove multiple layers with different materials. That is, the bonding dielectric material 130a and the protective layer 125 may be removed by a plurality of etching steps with different etching gases. In another embodiment, the etching process may include a dry etching process. The dry etching process may be performed by using an etching gas which includes O2, N2, CH4, or a combination thereof. In the case, the dry etching process is able to further remove a portion of the residues 123 so that the via hole 133 contacts with the pad 122, and the protective layer 125 may be used to control a depth of the via hole 133 and avoid the pad 122 from being damaged during the etching process. The via hole 133 may expose the pad 122. Thereafter, a conductive material layer and a barrier material layer (not shown) are formed on the bonding dielectric material 130c, and fills into the trench 137 and the via hole 133. The conductive material layer on the bonding dielectric material 130c is then removed by a planarization process such as a CMP process, and thus the via plug 134 and the metal feature 136 are formed in the via hole 133 and the trench 137 respectively. In some alternative embodiments, the trench 137 may be referred to as a greater via hole than the via hole 133.

In some other embodiments, the bonding metal layer 132 is formed as following steps (referred as a via hole first process). The bonding dielectric materials 130a and 130c, the blocking layer 130b and the protective layer 125 are patterned by lithography and etching processes to form via hole 133. In the case, the protective layer 125 is referred to as an etching stop layer for forming the via hole 133. In one embodiment, the etching process may include an anisotropic etching process. In another embodiment, the etching process may include a dry etching process. The dry etching process may be performed by using an etching gas which includes $O_2$, $N_2$, $CH_4$, or a combination thereof. Next, the bonding dielectric material 130c and the blocking layer 130b are patterned by lithography and etching processes to form the trench 137 therein. During the etching process, the blocking layer 130b is serves as an etching stop layer, and thus the blocking layer 130b is exposed or penetrated by the trench 137. Thereafter, the conductive material layer is formed and the planarization process is performed.

In alternative embodiments, the bonding metal layer 132 is formed as following steps (referred as the self-aligned process). After the bonding dielectric material 130a is formed, the blocking layer 130b is formed and patterned by lithography and etching processes to form via hole patterns therein. Next, the bonding dielectric material 130c is formed over the blocking layer 130b with the via hole patterns. The bonding dielectric material 130c fills into the via hole patterns of the blocking layer 130b and is in contact with the bonding dielectric material 130a. Thereafter, a patterned mask with trench patterns is formed on the bonding dielectric material 130c by a lithography process, some of the trench patterns are corresponding to the via hole patterns of the blocking layer 130b. Thereafter, an etching process is performed on the bonding dielectric material 130c by using the blocking layer 130b as an etching stop layer, so that the trench 137 is formed. In one embodiment, the etching process may include an anisotropic etching process. In another embodiment, the etching process may include a dry etching process. The dry etching process may be performed by using an etching gas which includes $O_2$, $N_2$, $CH_4$, or a combination thereof. At the same time, the bonding dielectric material 130a and the protective layer 125 are etched by using the blocking layer 130b with the via hole patterns as a hard mask, so that via hole 133 is formed in the bonding dielectric material 130a and the protective layer 125, and self-aligned with the trench 137. In the case, the protective layer 125 is referred to as an etching stop layer for forming the via hole 133. Thereafter, the conductive material layer is formed and the planarization process is performed.

In FIG. 1F, the blocking layer 130b has the same pattern as the bonding dielectric material 130c and both have trench 137. However, depending on the process, the blocking layer 130b may have the same pattern as the bonding dielectric material 130a and both have the via hole 133 as indicated by the dashed lines. In other word, a bottom of the trench 137 over the pad 122 exposes a portion of the blocking layer 130b, and the blocking layer 130b under the bottom of the trench 137 has a pattern of the via hole 133.

As shown in FIG. 1F, in one embodiment, a portion of the pad 122 (with the probe mark 127) may be referred to as a test pad for the CP test, while another portion of the pad 122 (without the probe mark 127) may be referred to as a connect pad which is electrically connected to or in contact with the bonding metal layer 132. Specifically, the bonding metal layer 132 is landed over another portion of the pad 122 and separated from the probe mark 127 by a distance 122d greater than zero. That is, the bonding metal layer 132 is not in direct contact with the probe mark 127. In the case, the connect pad is able to transfer the signal from the first die 101 to an overlying die. In some embodiments, the distance 122d may be less than a width of the pad 122; however, the embodiments of the present disclosure are not limited thereto.

Figure 2A:
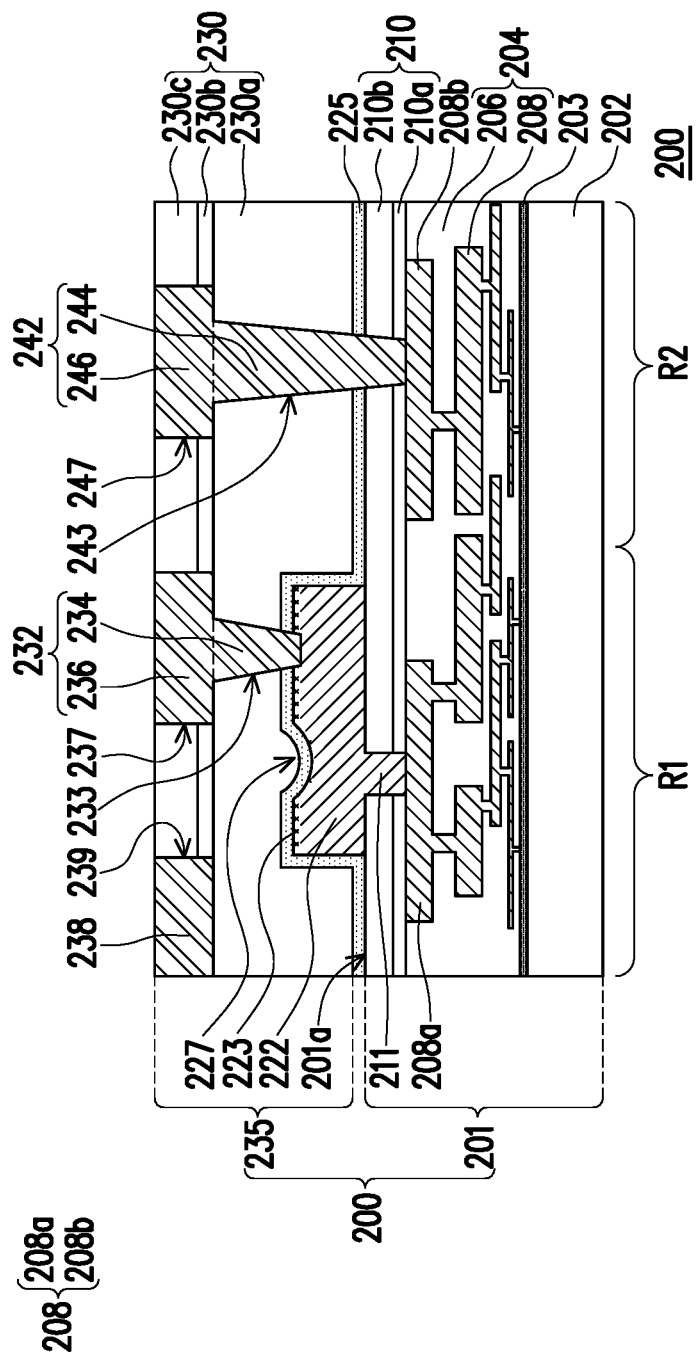
FIG. 2A to FIG. 2B are cross-sectional views of a method of forming a 3DIC structure in accordance with a second embodiment.
Figure 2B:
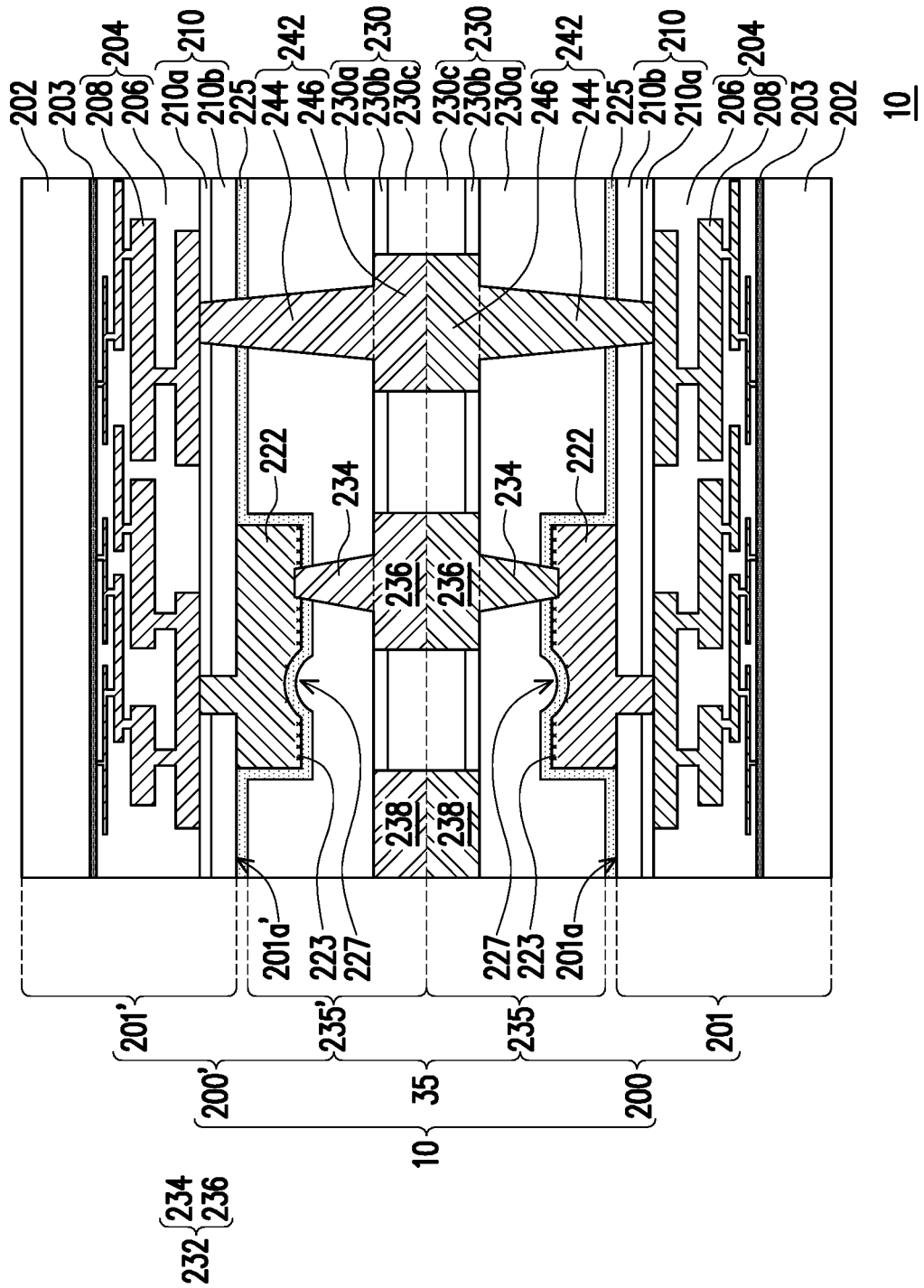

FIG. 2A to FIG. 2B are cross-sectional views of a method of forming a 3DIC structure in accordance with a second embodiment.

Referring to FIG. 2A, a semiconductor structure 200 is provided. In detail, the semiconductor structure 200 includes a second die 201 and a second bonding structure 235 disposed over a front side 201a of the second die 201. In some embodiments, the semiconductor structure 200 may include a semiconductor die, a semiconductor chip, a semiconductor wafer, or a combination thereof. The second die 201 may be an application-specific integrated circuit (ASIC) chip, an analog chip, a sensor chip, a wireless and radio frequency chip, a voltage regulator chip or a memory chips, for example. The second die 201 and the first die 101 may be the same type of dies or different types of dies.

In some embodiments, the second die 201 is similar to the first die 101. That is, the second die 201 includes a semiconductor substrate 202, a device region 203, an interconnect structure 204 (including an insulating material 206 and a plurality of metal features 208), a passivation layer 210 (including passivation materials 210a and 210b), a pad 222, a probe mark 227 at a top portion of the pad 222, and a protective layer 225. The arrangement, material and forming method of the second die 201 are similar to the arrangement, material and forming method of the first die 101. Thus, details thereof are omitted here. The first die 101 and the second die 201 illustrated in FIG. 1F may have different sizes. Herein, the term "size" is referred to the length, width, or area. For example, as shown in FIGS. 1F and 2A, the length of the second die 201 is greater than the length of the first die 101. However, the embodiments of the present disclosure are not limited thereto. In other embodiments, the size of the second die 201 may be the same as the size of the first die 101.

In some embodiments, the second bonding structure 235 includes a bonding dielectric layer 230, a first bonding metal layer 232, a second bonding metal layer 242, and a dummy metal feature 238. In detail, the first bonding metal layer 232 includes a via plug 234 and a metal feature 236. The via plug 234 penetrates through the bonding dielectric material 230a and the protective layer 225 to land on and contact the second pad 222. The metal feature 236 penetrates through the bonding dielectric material 230c and the blocking layer 230b to connect to the via plug 234. In other words, the first bonding metal layer 232 is electrically connected to the top metal feature 208a (or the interconnect structure 204) by the pad 222 and the plugs 211.

Similarly, the second bonding metal layer 242 includes a via plug 244 and a metal feature 246. The via plug 244 penetrates through the bonding dielectric material 230a, the protective layer 225, and the passivation layer 210 to land on and contact the top metal feature 208b. The metal feature 246 penetrates through the bonding dielectric material 230c and the blocking layer 230b to connect to the via plug 244. That is, the second bonding metal layer 242 is electrically or physical connected to the top metal feature 208b (or the interconnect structure 204). In the case, a height of the second bonding metal layer 242 is greater than a height of the first bonding metal layer 232. In the embodiment, as shown in FIG. 2A, a height of the via plug 244 is greater than a height of the via plug 234, while a height of the metal feature 246 is equal to a height of the metal feature 236.

On the other hand, the dummy metal feature 238 is optionally formed aside the first bonding metal layer 232. The dummy metal feature 238 is disposed in the bonding dielectric material 230c and the blocking layer 230b and exposed by the bonding dielectric material 230c. Herein, when elements are described as "dummy", the elements are electrically floating or electrically isolated from other elements. For example, as shown in FIG. 2A, the dummy metal feature 238 is electrically floating. In some embodiments, the dummy metal feature 238 is formed by a single damascene method.

In some embodiment, the dummy metal feature 238 and the metal features 236 and 246 are at substantially the same level. That is, tops of the dummy metal feature 238 and the metal feature 236 and 246 are substantially coplanar with the top surface of the bonding dielectric material 230c.

In some embodiments, the first bonding metal layer 232 and the second bonding metal layer 242 may include copper, copper alloys, nickel, aluminum, tungsten, a combination of thereof. The dummy metal feature 238 may include copper, copper alloys, nickel, aluminum, tungsten, a combination of thereof. In some embodiments, the first bonding metal layer 232, the second bonding metal layer 242, and the dummy metal feature 238 may have the same material. In some alternatively embodiments, the first bonding metal layer 232, the second bonding metal layer 242, and the dummy metal feature 238 may have different materials.

In some embodiments, the first bonding metal layer 232, the second bonding metal layer 242, and the dummy metal feature 238 are formed simultaneously. In some other embodiments, the first bonding metal layer 232, the second bonding metal layer 242, and the dummy metal feature 238 are successively formed. The first bonding metal layer 232, the second bonding metal layer 242, and the dummy metal feature 238 are formed by a trench first process, a via hole first process, or a self-aligned process.

For example, the first bonding metal layer 232, the second bonding metal layer 242, and the dummy metal feature 238 are formed as following steps (referred as the trench first process). The bonding dielectric material 230c and the blocking layer 230b are patterned by lithography and etching processes to form trenches 237, 247, and 239 therein. The trench 237 corresponds to the pad 222 and the trench 247 corresponds to the top metal feature 208b. During the etching process, the blocking layer 230b serves as an etching stop layer, and thus the blocking layer 230b is exposed or penetrated by the trenches 237, 247, and 239. Next, the bonding dielectric material 230a is patterned by another lithography and etching processes with the protective layer 225 as an etching stop layer and then the protective layer 225 is etched to form a via hole 233 therein. At the same time, the bonding dielectric material 230a, the protective layer 225, and the passivation layer 210 are patterned by the same lithography and etching processes to form a via hole 243 therein. In the embodiment, the etching process may include a dry etching process with a plurality of etching steps, which are used to remove multiple layers with different materials. That is, the protective layer 225 is referred to as an etching stop layer for forming the via holes 233 and 243. Specifically, the via hole 233 may stop on the protective layer 225 until the via hole 243 reaches the protective layer 225 during a first etching step. A second etching step is then performed to remove portions of the protective layer 225 and the passivation layer 210. In the second etching step, the pad 222 is referred to as an etching stop layer, namely, the via hole 233 may stop on the pad 222 until the via hole 243 reaches the top metal feature 208b. Further, the second etching step is able to further remove a portion of the residues 223 to contact the pad 222. As above, the protective layer 225 may be used to control depths of the via holes 233 and 243, so that the via holes 233 and 243 with different depths are formed simultaneously. In other embodiments, the first bonding metal layer 232, the second bonding metal layer 242, and the dummy metal feature 238 may be formed in the via hole first process and the self-aligned process at the same time and are illustrated in above embodiments. Thus, details thereof are omitted here.

Figure 6:
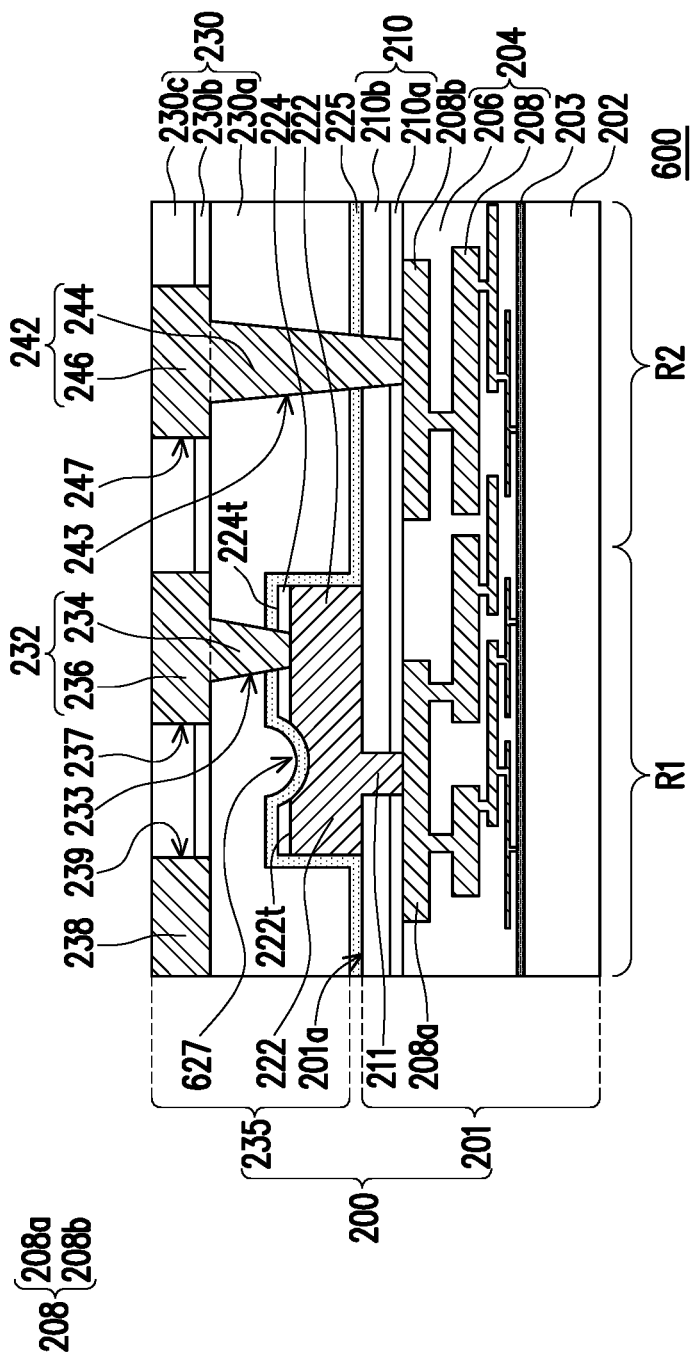
FIG. 6 is a cross-sectional view showing a semiconductor structure in accordance with a sixth embodiment.

From another perspective, the semiconductor structure 200 may include a first region R1 and a second region R2. The pad 222 and the first bonding metal layer 232 contacting the pad 222 are located in the first region R1. The second bonding metal layer 242 is located in the second region R2. The structure in first region R1 is similar to the semiconductor structure 100 illustrated in FIG. 1F. However, the embodiments of the present disclosure are not limited thereto. The structure in the first region R1 may be replaced by another structure (as shown in FIG. 6).

Referring to FIG. 2B, another semiconductor structure 200' is provided. In detail, the semiconductor structure 200' includes another second die 201' and another second bonding structure 235' disposed over a front side 201a' of the second die 201'. The second dies 201 and 201' may be the same type of dies or different types of dies. The arrangement, material and forming method of the second die 201' and the second bonding structure 235' are similar to the arrangement, material and forming method of the second die 201 and the second bonding structure 235. Thus, details thereof are omitted here.

Referring to FIG. 2B, the semiconductor structure 200' is further turned upside down and mounted onto the semiconductor structure 200. That is, the second die 201' and the second die 201 are face-to-face bonded together via the second bonding structure 235' and the second bonding structure 235 to form the 3DIC structure 10 (or referred as a die stack structure 10). However, the embodiments of the present disclosure are not limited thereto. In other embodiments, the second die 201' and the second die 201 may be face-to-back bonded together. Hereinafter, the second die 201' of the semiconductor structure 200' is referred to as a top die 201', and the second die 201 of the semiconductor structure 200 is referred to as a bottom die 201.

In some embodiments, before the top die 201' is bonded to the bottom die 201, the second bonding structure 235' and the second bonding structure 235 are aligned, so that the dummy metal features 238 are bonded together, the first bonding metal layers 232 are bonded together, the second bonding metal layers 242 are bonded together, and the bonding dielectric layers 230 are bonded together. In some embodiments, the alignment of the second bonding structure 235' and the second bonding structure 235 may be achieved by using an optical sensing method. After the alignment is achieved, the second bonding structure 235' and the second bonding structure 235 are bonded together by a hybrid bonding to form a hybrid bonding structure 35.

The second bonding structure 235' and the second bonding structure 235 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 2A, the hybrid bonding structure 35 includes the dummy metal features 238 bonded together by metal-to-metal bonding, the first bonding metal layers 232 bonded together by metal-to-metal bonding, the second bonding metal layers 242 bonded together by metal-to-metal bonding, and the bonding dielectric layers 230 bonded together by non-metal-to-non-metal bonding. However, the embodiments of the present disclosure are not limited thereto. In other embodiments, the second bonding structure 235' and the second bonding structure 235 may be bonded together by other bonding, such as fusion bonding.

FIG. 3A to FIG. 3D are cross-sectional views of a method of forming a semiconductor structure in accordance with a third embodiment.

Figure 3A:
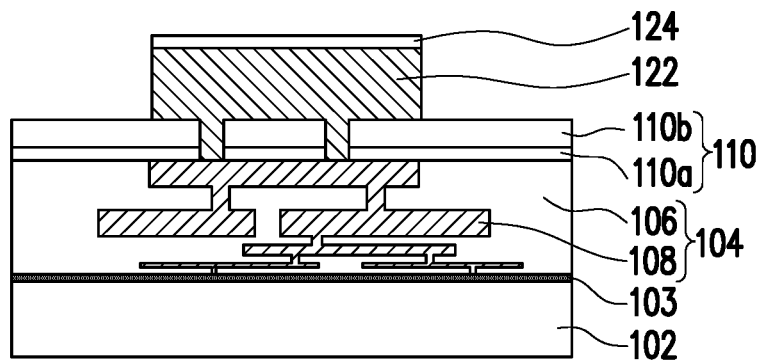
FIG. 3A to FIG. 3D are cross-sectional views of a method of forming a semiconductor structure in accordance with a third embodiment.
Figure 3B:
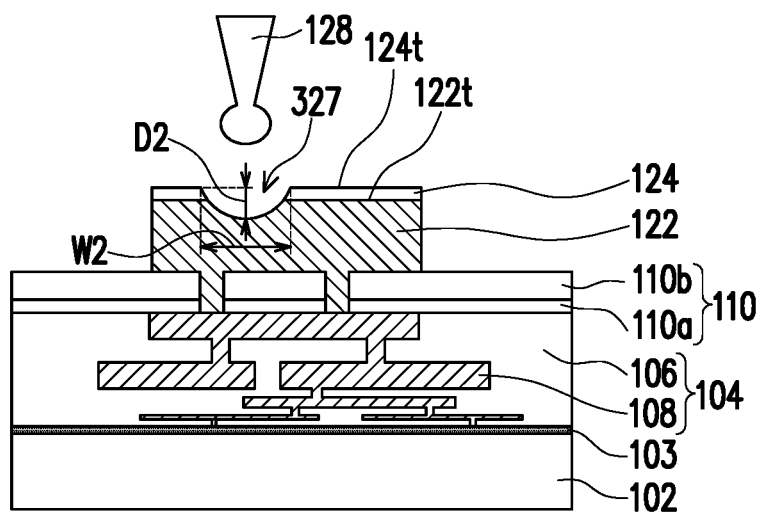

Referring to FIG. 3A and FIG. 3B, a structure 301' is followed by the structure illustrated in FIG. 1C. After the structure 301' is formed, a circuit probing (CP) test is performed on the pad 122 which the cap layer 124 is thereon. Specifically, a probe 128 may penetrate the cap layer 124 to electrically couple to the pad 122 for wafer or die testing to check whether the die is a good die. In some embodiments, the pad 122 is used for electrical testing to check whether a third die 301 illustrated in FIG. 3B is a good die, but the disclosure is not limited thereto. It should be noted that the third die 301 is selected to proceed the following process when the third die 301 is identified as a known good die (KGD). In the case, as shown in FIG. 3B, a probe mark 327 is formed on a top surface 122t of the pad 122, and the probe mark 327 may be a recess concaving or recessing from a top surface 124t of the cap layer 124 into the pad 122. In some embodiments, the probe mark 327 may have a depth D2 of 50 nm to 2000 nm, and a width W2 of 1000 nm to 50000 nm. Herein, the depth D2 is a vertical distance between a topmost point (or the top surface 124t of the cap layer 124) and a bottommost point of the probe mark 327. In some alternative embodiments, the depth D2 may be greater than the depth D1 illustrated in FIG. 1D, and the width W2 may be greater than or equal to the width W1 illustrated in FIG. 1D by using the same probe in the same CP test apparatus.

Figure 3C:
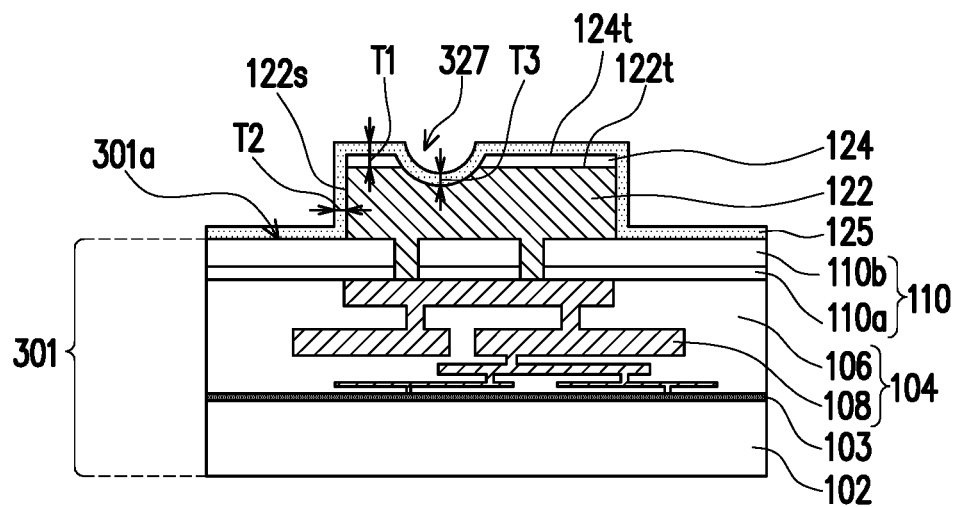

Referring to FIG. 3C, after the CP test, a protective layer 125 is formed over the pad 122 and the cap layer 124. In detail, the protective layer 125 conformally covers and is in direct contact with the top surface 124t of the cap layer 124, the probe mark 327, sidewalls 122s of the pad 122, and a top surface of the passivation layer 110. In some embodiments, the protective layer 125 may include a dielectric layer, such as silicon nitride, silicon oxynitride or a combination thereof, and has a thickness of 50 nm to 100 nm. When the thickness of the protective layer 125 is greater than the depth D2 of the probe mark 327, the protective layer 125 may fill up the probe mark 327, as shown in FIGS. 3B and 3C. That is, a lowest point of a top surface of the protective layer 125 directly over the probe mark 327 may be higher than the top surface 124t of the cap layer 124. On the other hand, when the thickness of the protective layer 125 is less than the depth D2 of the probe mark 327, the protective layer 125 may not fill up the probe mark 327. That is, the lowest point of the top surface of the protective layer 125 directly over the probe mark 327 may be lower than the top surface 124t of the cap layer 124. In other embodiments, the lowest point of the top surface of the protective layer 125 directly over the probe mark 327 and the top surface 124t of the cap layer 124 may be at the same level.

In another embodiment, the protective layer 125 is referred to as an anti-reflective coating (ARC) layer, which may include an organic ARC material (e.g., polymer resin), an inorganic ARC material (e.g., SiON), or a combination thereof. In some alternatively embodiments, the protective layer 125 may be a single layer or multiple layers and may be formed by a suitable process such as CVD, ALD, or the like. In other embodiments, the protective layer 125 and the cap layer 124 may have different materials. That is, an interface may be formed between the protective layer 125 and the cap layer 124. In the case, as shown in FIG. 3C, a dielectric material covering on the top surface 122t of the pad 122 may have a thickness T1, wherein the dielectric material includes the protective layer 125 and the cap layer 124. Another dielectric material covering on the sidewalls 122s of the pad 122 may have a thickness T2, wherein the another dielectric material includes the protective layer 125. The other dielectric material covering on the probe mark 327 may have a thickness T3, wherein the other dielectric material includes the protective layer 125. In the embodiment, the thickness T1 may be greater than the thickness T2 or T3, and the thickness T2 may be equal to or less than the thickness T3.

Figure 3D:
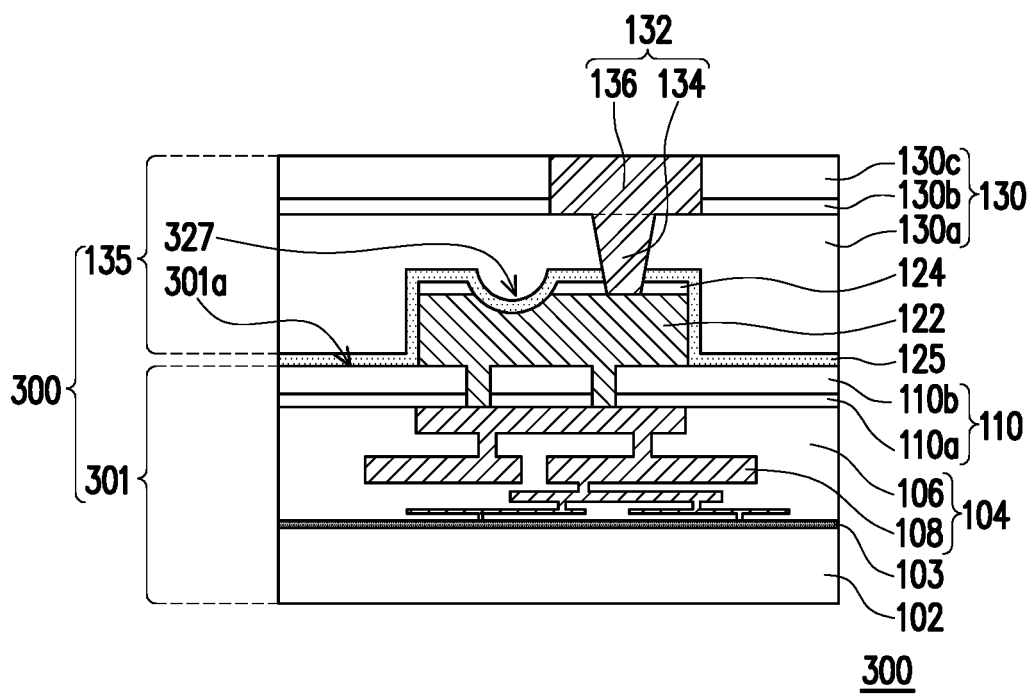

Referring to FIG. 3D, after forming the protective layer 125, a first bonding structure 135 is formed over the protective layer 125 or a front side 301a of the third die 301, thereby forming a semiconductor structure 300. The first bonding structure 135 includes a bonding metal layer 132 formed in a bonding dielectric layer 130. The bonding metal layer 132 penetrates the bonding dielectric layer 130, the protective layer 125, and the cap layer 124 to land on and contact the pad 122. The arrangement, material and forming method of the bonding metal layer 132 and the bonding dielectric layer 130 are illustrated in above embodiments. Thus, details thereof are omitted here.

FIG. 4A to FIG. 4D are cross-sectional views of a method of forming a semiconductor structure in accordance with a fourth embodiment.

Figure 4A:
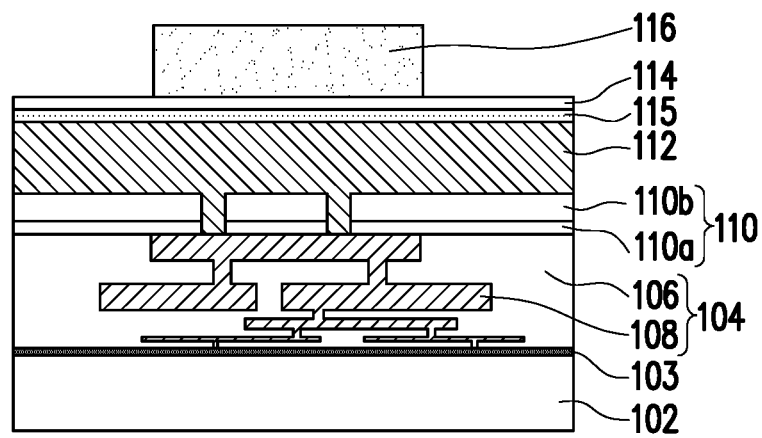
FIG. 4A to FIG. 4D are cross-sectional views of a method of forming a semiconductor structure in accordance with a fourth embodiment.

Referring to FIG. 4A, a structure 401' is similar to the structure illustrated in FIG. 1B. A difference therebetween lies in that the structure 401' includes a protective material 115 disposed between the conductive material 112 and the cap material 114. In some embodiments, the protective material 115 may include a dielectric layer, such as silicon nitride, silicon oxynitride or a combination thereof, and has a thickness of 50 nm to 100 nm. In another embodiment, the protective material 115 is referred to as an anti-reflective coating (ARC) layer, which may include an organic ARC material (e.g., polymer resin), an inorganic ARC material (e.g., SiON), or a combination thereof. In some alternatively embodiments, the protective material 115 may be a single layer or multiple layers and may be formed by a suitable process such as CVD, ALD, or the like. In other embodiments, the protective material 115 and the cap material 114 may have different materials.

Figure 4B:
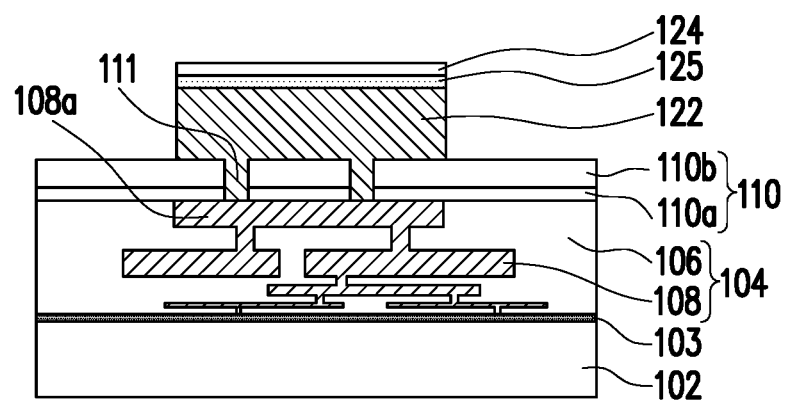

Referring to FIG. 4A and FIG. 4B, after the mask pattern 116 is formed, a first etching process is performed by using the mask pattern 116 as an etching mask to remove portions of the cap material 114, the protective material 115, and the conductive material 112, so as to expose the passivation material 110b. In some embodiments, the first etching process may include a dry etching process, a wet etching process, or a combination thereof. In the case, as shown in FIG. 4B, a pad 122, a cap layer 124, and a protective layer 125 disposed between the pad 122 and the cap layer 124 are formed. The pad 122 is electrically connected to the top metal feature 108a by the plugs 111. In some embodiments, the pad 122 may be aligned with or partially overlapped with the top metal feature 108a. Although only one pad 122, one protective layer 125, and one cap layer 124 are illustrated in FIG. 4B, the embodiments of the present disclosure are not limited thereto. In other embodiments, the number of the pad 122, the protective layer 125, and the cap layer 124 may be adjusted by the need.

Figure 4C:
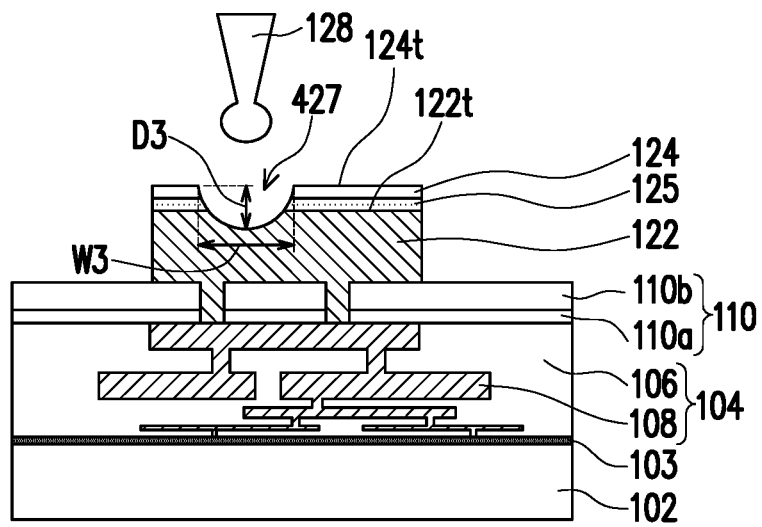

Referring to FIG. 4B and FIG. 4C, after the mask pattern 116 is removed, a circuit probing (CP) test is performed on the pad 122. Specifically, a probe 128 may penetrate the cap layer 124 and the protective layer 125 to electrically couple to the pad 122 for wafer or die testing to check whether the die is a good die. In some embodiments, the pad 122 is used for electrical testing to check whether a fourth die 401 illustrated in FIG. 4C is a good die, but the disclosure is not limited thereto. It should be noted that the fourth die 401 is selected to proceed the following process when the fourth die 401 is identified as a known good die (KGD). In the case, as shown in FIG. 4C, a probe mark 427 is formed on a top surface 122t of the pad 122, and the probe mark 427 may be a recess concaving or recessing from a top surface 124t of the cap layer 124 through the protective layer 125 and then into the pad 122. In some embodiments, the probe mark 427 may have a depth D3 of 100 nm to 2000 nm, and a width W3 of 1000 nm to 50000 nm. Herein, the depth D3 is a vertical distance between a topmost point (or the top surface 124t of the cap layer 124) and a bottommost point of the probe mark 427. In some alternative embodiments, the depth D3 may be greater than the depth D2 illustrated in FIG. 3B, and the width W3 may be greater than or equal to the width W2 illustrated in FIG. 3B by using the same probe in the same CP test apparatus.

Figure 4D:
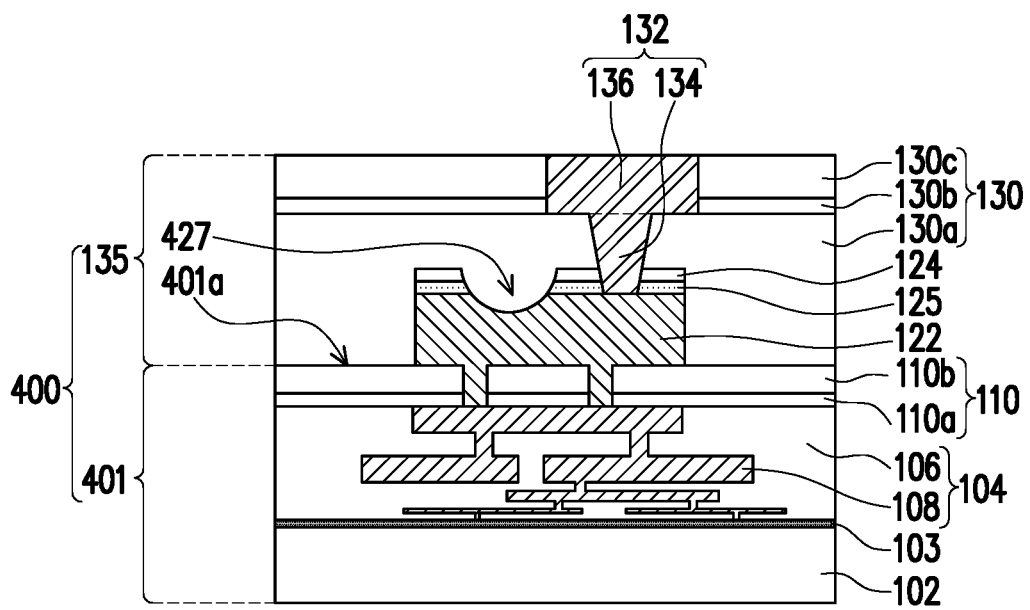

Referring to FIG. 4D, after the CP test, a first bonding structure 135 is formed over a front side 401a of the fourth die 401, thereby forming a semiconductor structure 400. The first bonding structure 135 includes a bonding metal layer 132 formed in a bonding dielectric layer 130. In some embodiments, the bonding dielectric layer 130 (or the bonding dielectric material 130a) is formed over the pad 122 and filled in the probe mark 427. In the case, the bonding dielectric material 130a is in contact with the pad 122 exposed by the probe mark 427. That is, the bonding dielectric material 130a is filled in and in direct contact with the probe mark 427. The bonding metal layer 132 penetrates the bonding dielectric layer 130, the cap layer 124, and the protective layer 125 to land on and contact the pad 122. The arrangement, material and forming method of the bonding metal layer 132 and the bonding dielectric layer 130 are illustrated in above embodiments. Thus, details thereof are omitted here.

Figure 5:
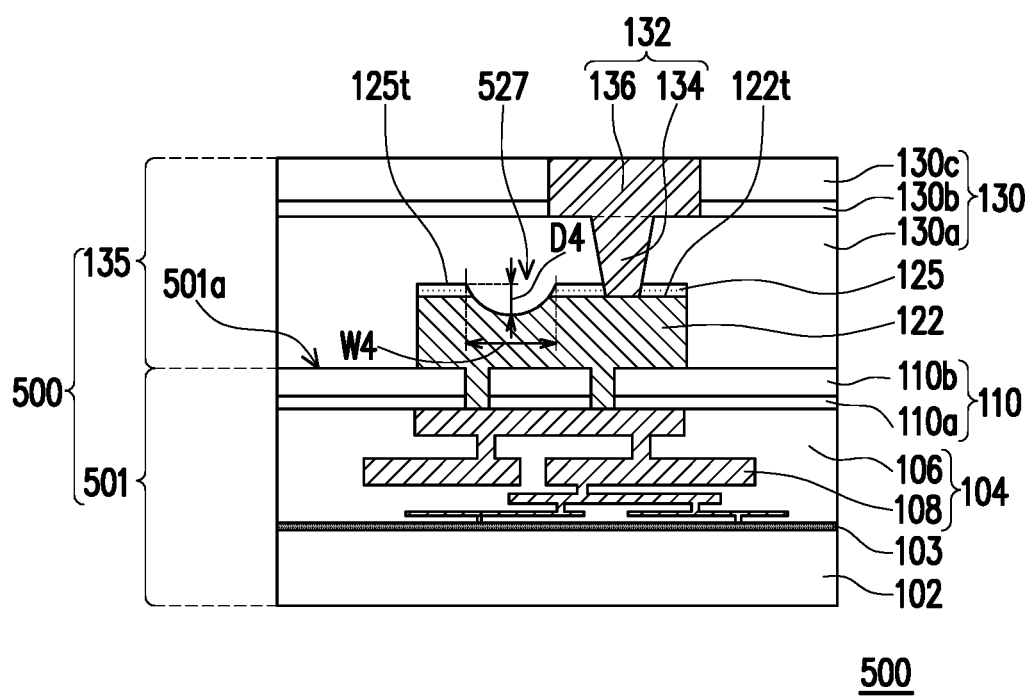
FIG. 5 is a cross-sectional view showing a semiconductor structure in accordance with a fifth embodiment.

FIG. 5 is a cross-sectional view showing a semiconductor structure in accordance with a fifth embodiment.

Referring to FIG. 5, a semiconductor structure 500 is similar to the semiconductor structure 400 illustrated in FIG. 4D. A difference therebetween lies in that the semiconductor structure 500 includes a fifth die 501 having a pad 122 and a protective layer 125 over the pad 122. A probe mark 527 is formed on a top surface 122t of the pad 122, and the probe mark 527 may be a recess concaving or recessing from a top surface 125t of the protective layer 125 into the pad 122. In some embodiments, the probe mark 527 may have a depth D4 of 50 nm to 2000 nm, and a width W4 of 1000 nm to 50000 nm. Herein, the depth D4 is a vertical distance between a topmost point (or the top surface 125t of the protective layer 125) and a bottommost point of the probe mark 527. In some alternative embodiments, the depth D4 may be less than the depth D3 illustrated in FIG. 4C, and the width W4 may be less than or equal to the width W3 illustrated in FIG. 4C by using the same probe in the same CP test apparatus.

FIG. 6 is a cross-sectional view showing a semiconductor structure in accordance with a sixth embodiment.

Referring to FIG. 6, a semiconductor structure 600 is similar to the semiconductor structure 200 illustrated in FIG. 2B. A difference therebetween lies in that the structure in the first region R1 illustrated in FIG. 6 is replaced by the structure 300 of FIG. 3D. In the case, a probe mark 627 is formed on a top surface 222t of the pad 222, and the probe mark 627 may be a recess concaving or recessing from a top surface 224t of the cap layer 224 into the pad 222. However, the embodiments of the present disclosure are not limited thereto. The structure in the first region R1 may be replaced by the structure 400 of FIG. 4D or the structure 500 of FIG. 5. On the other hand, one of the semiconductor structures 100, 300, 400, and 500 may have the second bonding metal layer 242 and/or the dummy metal feature 238. The second bonding metal layer 242 penetrates through the bonding dielectric layer 230, the protective layer 225, and the passivation layer 210 to land on and contact the top metal feature 208b. The dummy metal feature 238 is disposed in the bonding dielectric material 230c and the blocking layer 230b and exposed by the bonding dielectric material 230c.

It should be noted that, in some embodiments, any two of the semiconductor structures 100, 200, 200', 300, 400, 500, and 600 may be bonded together by the hybrid bonding structure 35, so as to form the 3DIC structure. In some alternative embodiments, one of the semiconductor structures 100, 300, 400, and 500 may optional have a second bonding metal layer and/or a dummy metal feature disposed aside the first bonding metal layer 132, wherein the number and the arrangement of the first bonding metal layer 132, the second bonding metal layer, and the dummy metal feature are not limited thereto.

In summary, a portion of the pad is referred to as the test pad for the CP test, and another portion of the pad is referred to as the connect pad for signal transfer. In the case, the semiconductor structure having the pad with multiple functions is able to increase the usage area efficiently. In addition, the protective layer at least covering the top surface of the pad is used as the etching stop layer, so that the first bonding metal layer is landed on the pad and the second bonding metal layer is landed on the top metal feature simultaneously. In the case, the protective layer is able to control the process better without over-etching the pad.

According to some embodiments, a semiconductor structure includes a substrate, an interconnect structure, a pad, a protective layer, and a bonding structure. The interconnect structure is disposed over the substrate. The pad is disposed over and electrically connected to the interconnect structure. A top surface of the pad has a probe mark and the probe mark has a concave surface. The protective layer conformally covers the top surface of the pad and the probe mark. The bonding structure is disposed over the protective layer. The bonding structure includes a bonding dielectric layer and a first bonding metal layer penetrating the bonding dielectric layer and the protective layer to electrically connect to the pad.

According to some embodiments, a semiconductor structure includes a substrate, an interconnect structure, a pad, a protective layer, and a bonding structure. The interconnect structure is disposed over the substrate. The pad is disposed over and electrically connected to the interconnect structure. The protective layer is disposed over the pad. A top surface of the pad has a probe mark and the probe mark has a concave surface. The bonding structure is disposed over the protective layer. The bonding structure includes a bonding dielectric layer and a first bonding metal layer penetrating the bonding dielectric layer and the protective layer to electrically connect to the pad.

According to some embodiments, a method of manufacturing a semiconductor structure includes forming an interconnect structure over a substrate; forming a pad over and electrically connected to the interconnect structure; a circuit probing (CP) test is performed on the pad to form a probe mark over a top surface of the pad; forming a protective layer over the top surface of the pad; and forming a bonding structure over the protective layer, wherein the forming the bonding structure comprises forming a bonding dielectric layer and forming a first bonding metal layer penetrating the bonding dielectric layer and the protective layer to electrically connect to the pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an interconnect structure, disposed over a substrate;
   a pad, disposed over and electrically connected to the interconnect structure, wherein a top surface of the pad has a probe mark and the probe mark has a first concave surface;
   a protective layer, conformally covering the top surface of the pad and the probe mark; and
   a bonding structure, disposed over the protective layer, wherein the bonding structure comprises:
      a bonding dielectric layer;
      a first bonding metal layer penetrating the bonding dielectric layer and the protective layer to electrically connect to the pad; and
      a second bonding metal layer aside the pad, wherein the second bonding metal layer penetrates the bonding dielectric layer and the protective layer to electrically connect to the interconnect structure.

2. The semiconductor structure of claim 1, further comprising:

a passivation layer, disposed between the pad and the interconnect structure, and between the bonding structure and the interconnect structure, wherein the protective layer extends to cover sidewalls of the pad and a top surface of the passivation layer.

3. The semiconductor structure of claim 1, wherein a height of the second bonding metal layer is greater than a height of the first bonding metal layer.

4. The semiconductor structure of claim 1, wherein the first bonding metal layer is landed over the pad and separated from the probe mark by a distance greater than zero.

5. The semiconductor structure of claim 1, wherein the protective layer is in direct contact with the probe mark and the protective layer has a second concave surface corresponding to the first concave surface of the probe mark.

6. The semiconductor structure of claim 5, wherein the bonding dielectric layer comprises:
   a first bonding dielectric material covering the pad and contacting the second concave surface of the protective layer;
   a second bonding dielectric material disposed over the first bonding dielectric material; and
   a blocking layer disposed between the first bonding dielectric material and the second bonding dielectric material.

7. The semiconductor structure of claim 1, further comprising:
   a cap layer disposed between the top surface of the pad and the protective layer, wherein the probe mark is recessed from a top surface of the cap layer into the top surface of the pad.

8. The semiconductor structure of claim 7, further comprising:
   a passivation layer, disposed between the pad and the interconnect structure, and between the bonding structure and the interconnect structure, wherein the protective layer conformally covers the top surface of the cap layer and the probe mark, and extends to cover sidewalls of the pad and a top surface of the passivation layer.

9. A semiconductor structure, comprising:
   an interconnect structure, disposed over a substrate;
   a pad, disposed over and electrically connected to the interconnect structure;
   a protective layer, disposed over the pad, wherein a top surface of the pad has a probe mark and the probe mark has a concave surface; and
   a bonding structure, disposed over the protective layer, wherein the bonding structure comprises a bonding dielectric layer and a first bonding metal layer penetrating the bonding dielectric layer and the protective layer to connect to the pad, and
   the bonding dielectric layer at least comprises a first bonding dielectric material covering the pad and being in direct contact with the probe mark.

10. The semiconductor structure of claim 9, further comprising:
    a cap layer disposed over a top surface of the protective layer, wherein the probe mark is recessed from a top surface of the cap layer into the top surface of the pad.

11. The semiconductor structure of claim 10, wherein the first bonding metal layer penetrates the cap layer and the protective layer to electrically connect to the pad.

12. The semiconductor structure of claim 9, further comprising:
    a passivation layer, disposed between the pad and the interconnect structure, and between the bonding structure and the interconnect structure.

13. The semiconductor structure of claim 12, wherein the bonding dielectric layer further comprises:
    a second bonding dielectric material disposed over the first bonding dielectric material; and
    a blocking layer disposed between the first bonding dielectric material and the second bonding dielectric material.

14. The semiconductor structure of claim 12, wherein the bonding structure comprises a second bonding metal layer disposed aside the pad, and the second bonding metal layer penetrates the bonding dielectric layer and the passivation layer to electrically connect to the interconnect structure.

15. The semiconductor structure of claim 14, wherein a height of the second bonding metal layer is greater than a height of the first bonding metal layer.

16. A method of manufacturing a semiconductor structure, comprising:
    forming an interconnect structure over a substrate;
    forming a pad over and electrically connected to the interconnect structure;
    performing a circuit probing (CP) test on the pad to form a probe mark over a top surface of the pad;
    forming a protective layer over the top surface of the pad before performing the CP test; and
    forming a bonding structure over the protective layer, wherein the forming the bonding structure comprises forming a bonding dielectric layer and forming a first bonding metal layer penetrating the bonding dielectric layer and the protective layer to electrically connect to the pad, wherein the bonding dielectric layer is in direct contact with the probe mark.

17. The method of claim 16, wherein the probe mark is recessed from a top surface of the protective layer into the top surface of the pad.

18. The method of claim 16, further comprising:
    forming a cap layer over the protective layer before performing the CP test, wherein the probe mark is recessed from a top surface of the cap layer into the top surface of the pad.

19. The method of claim 16, wherein the forming the bonding structure further comprises forming a second bonding metal layer aside the pad.

20. The method of claim 19, wherein a height of the second bonding metal layer is greater than a height of the first bonding metal layer.

* * * * *